United States Patent [19]

Yamanaka

[11] 4,027,242

[45] May 31, 1977

[54] DOUBLE SUPERHETERODYNE MULTICHANNEL RECEIVER WITH A PHASE-LOCKED LOOP FREQUENCY SYNTHESIZER

[75] Inventor: Hiromasa Yamanaka, Tokyo, Japan

[73] Assignee: Shinto Denki Co., Ltd., Tokyo, Japan

[22] Filed: Oct. 23, 1975

[21] Appl. No.: 625,117

[30] Foreign Application Priority Data

Apr. 7, 1975 Japan .................. 50-42110

[52] U.S. Cl. .................. 325/17; 325/25; 325/421; 325/433
[51] Int. Cl.$^2$ .................. H04B 1/40
[58] Field of Search .................. 325/15, 25, 17–22, 325/419–423, 431–433, 453, 460; 343/180

[56] References Cited

UNITED STATES PATENTS

| | | | |
|---|---|---|---|
| 3,054,057 | 9/1962 | Bettin et al. | 325/20 |
| 3,409,836 | 11/1968 | Wallett | 325/421 |
| 3,641,434 | 2/1972 | Yates et al. | 325/25 |
| 3,805,192 | 4/1974 | Ocnaschek et al. | 325/419 |
| 3,835,384 | 9/1974 | Liff | 325/25 |

Primary Examiner—Benedict V. Safourek
Assistant Examiner—Jin F. Ng
Attorney, Agent, or Firm—Woodcock Washburn Kurtz & Mackiewicz

[57] ABSTRACT

A double superheterodyne receiver having a single local oscillator which supplies a signal of a predetermined frequency to a second frequency converter or mixer, where a second intermediate frequency signal is produced for final detection. The local oscillator signal is also supplied via a frequency divider to a phase-locked loop frequency synthesizer as a reference frequency signal. The frequency synthesizer supplies to a first frequency converter or mixer a signal with a frequency selected in accordance with the incoming signal frequency to produce a first intermediate frequency signal, which is subsequently combined with the local oscillator signal in the second frequency converter to provide the second intermediate frequency signal. The invention is disclosed as adapted for a multichannel transceiver.

2 Claims, 4 Drawing Figures

DOUBLE SUPERHETERODYNE MULTICHANNEL RECEIVER WITH A PHASE-LOCKED LOOP FREQUENCY SYNTHESIZER

BACKGROUND OF THE INVENTION

This invention relates generally to receivers, and more specifically to a double superheterodyne receiver capable of multichannel reception. The receiver according to the invention is particularly well adaptable for use in the form of a multichannel transceiver.

As is well known, a double superheterodyne receiver employs two frequency converters or mixers for dual heterodyning before final detection or demodulation to the original intelligence. For multichannel reception by this type of receivers, therefore, the output signal (the second intermediate frequency signal) from the second frequency converter is required to have a constant frequency of, for example, 455 kHz regardless of the frequency of the incoming modulated radio frequency signal. To this end there have heretofore been employed two crystal-controlled local oscillators which supply to the respective frequency converters the signals with frequencies selected in accordance with the incoming signal frequency (see FIG. 1 of the accompanying drawings).

This prior art configuration requires a large number of quartz crystals to permit the local oscillators to produce different frequency signals. When the double superheterodyne receiver of this type is adapted for a transceiver for 23-channel communication in the citizens' waveband, as many as 10 quartz crystals are necessary in its receiver section, and another four in the transmitter section.

More recently a double superheterodyne receiver or transceiver has been developed in which one of the local oscillators is replaced by a frequency synthesizer based on the phase-locked loop (PLL) principle. The use of the PLL frequency synthesizer succeeds in a drastic decrease in the number of quartz crystals in use, as will be later explained in some more detail. According to the concepts of this invention, however, the number of the quartz crystals or of the crystal oscillators themselves is not yet reduced to an absolute minimum by the use of the PLL frequency synthesizer in the conventional way.

SUMMARY OF THE INVENTION

It is an object of this invention to provide an improved double superheterodyne multichannel receiver of extremely simplified and inexpensive configuration.

Another object of the invention is to provide a receiver of the character described which is particularly well adaptable for a multichannel transceiver.

Briefly stated, this invention provides, in a double superheterodyne multichannel receiver of the well known type, the improvement comprising a local oscillator for supplying an output signal of a predetermined frequency to the second frequency converter, a frequency divider for dividing the output frequency of the local oscillator at a predetermined ratio to provide a reference frequency signal, and a phase-locked loop frequency synthesizer supplied with the reference frequency signal from the frequency divider for delivering to the first frequency converter a signal having a frequency selected in accordance with the incoming signal frequency.

Thus, in the first frequency converter, the incoming radio frequency signal is combined with the output from the PLL frequency synthesizer to provide a first intermediate frequency having a constant value regardless of the incoming signal frequency. The second frequency converter combines the first intermediate frequency signal from the first frequency converter with the local oscillator signal to produce a second, lower intermediate frequency signal, which is to be subsequently amplified and demodulated through the conventional procedure.

It may have been noted that the signals supplied to the first and second frequency converters for heterodyning are derived essentially from a single local oscillator. If this local oscillator is of the crystal-controlled type, a single quartz crystal is sufficient for the entire multichannel receiver as the oscillator is intended for one output frequency.

Typically, the PLL frequency synthesizer comprises a phase comparator circuit inclusive of a low-pass filter and amplifier, a voltage-controlled oscillator, and a programmable frequency divider. The frequency dividing ratio of the programmable divider is variable by a separate encoder having a channel selector switch, and the output signal with the selected frequency is delivered from the voltage-controlled oscillator to the first frequency converter.

According to a preferred embodiment of this invention, in which the receiver is incorporated in a transceiver, the output from the PLL frequency synthesizer is supplied not only to the first frequency converter but to a third frequency converter in the transmitter section. In addition, the output from another local oscillator having a frequency equal to the frequency of the first intermediate frequency is supplied to the third frequency converter so as to produce a signal of desired transmitting frequency. This transceiver configuration has the advantage that multichannel communication is possible with the use of only two crystal-controlled oscillators, each with one quartz crystal.

The features which are considered characteristic of this invention are set forth with particularity in the appended claims. The invention itself, however, both as to its organization and mode of operation, together with additional objects and advantages thereof, will become apparent in the course of the following description read in connection with the accompanying drawings in which like reference characters refer to like parts throughout the several views.

DETAILED DESCRIPTION

As the receiver according to this invention is intended primarily for use in combination with a transmitter, a typical prior art transceiver may first be shown and described in some more detail, the better to make clear the features and advantages of the invention.

Figure 1:
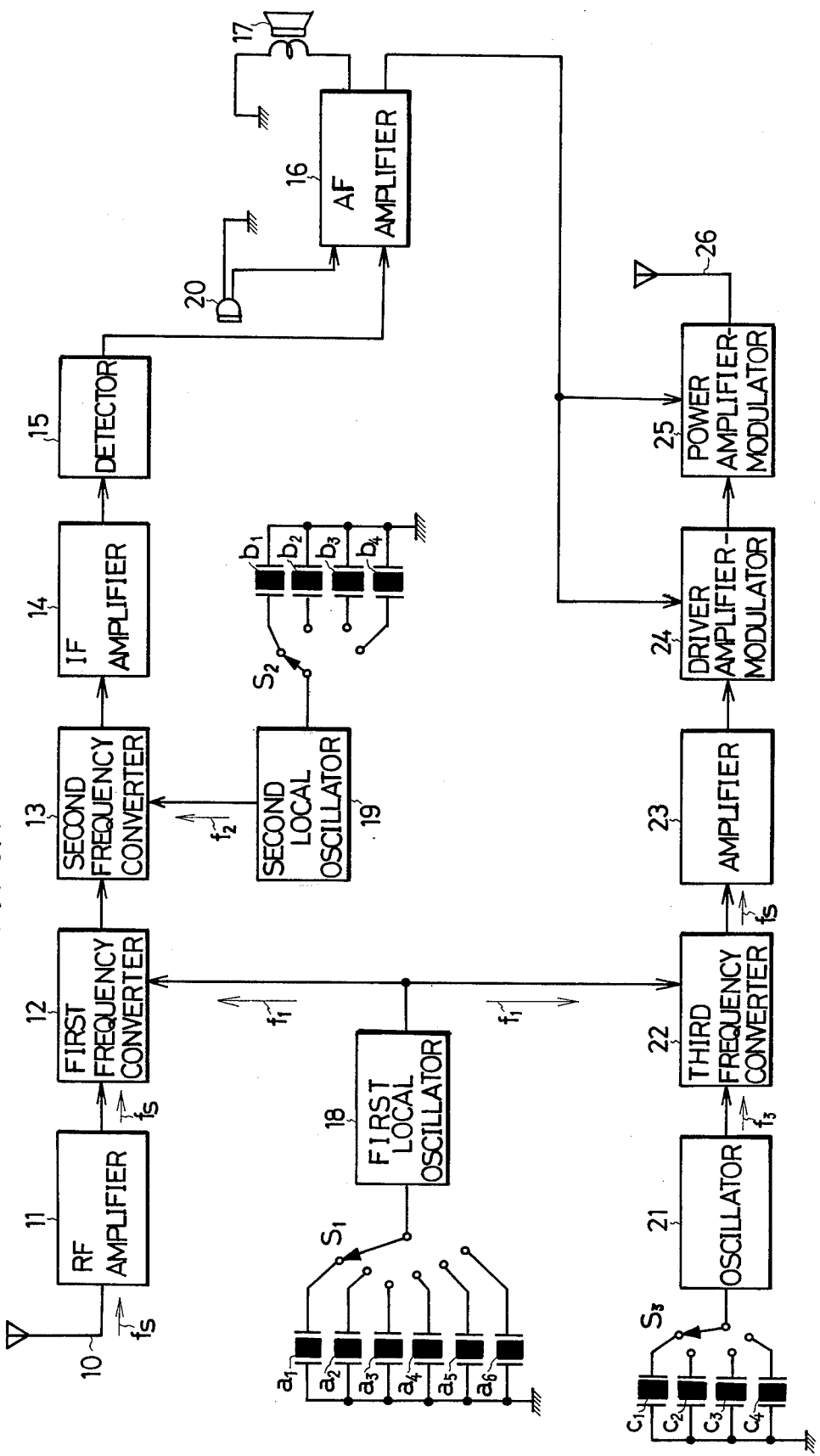
FIG. 1 is a block diagram of a typical prior art transceiver comparable with this invention.

With reference therefore to FIG. 1 the illustrated prior art transceiver has its receiver section composed of a receiving antenna circuit 10, radio-frequency (RF) amplifier 11, first frequency converter or mixer 12, second frequency converter or mixer 13, intermediate-frequency (IF) amplifier 14, detector 15, audio-frequency (AF) amplifier 16, loudspeaker 17, and first and second crystal-controlled local oscillators 18 and 19.

The receiving antenna circuit 10 comprises an antenna, tuning circuit and so forth. The incoming modulated RF signal in the frequency band of, say, 26.965 to 27.255 MHz is amplified by the RF amplifier 11 and delivered to the first frequency converter 12, where the amplified RF signal is combined with a signal $f1$ from the first local oscillator 18 to provide a first IF signal with a frequency of about 10.7 MHz. This first IF signal is subsequently combined, in the second frequency converter 13, with a signal $f2$ from the second local oscillator 19 to provide a second IF signal with a constant frequency of, say, 455 kHz. The second IF signal is then amplified by the IF amplifier 14, demodulated by the detector 15, and translated into audible sound by the output means comprising the AF amplifier 16 and loudspeaker 17.

The first local oscillator 18 is selectively connectable to any of six quartz crystals $a1$ to $a6$ by means of a switch S1. The aforesaid first local oscillator signal $f1$, therefore, may be any of the following six frequencies: 37.85, 37.80, 37.75, 37.70, 37.65, and 37.60 MHz. Likewise, the second local oscillator 19 is selectively connectable to any of four quartz crystals $b1$ to $b4$ by means of a switch S2 to provide the second local oscillator signal $f2$ with a frequency of 10.18, 10.19, 10.16, or 10.14 MHz.

The transmitter section of this prior art transceiver comprises a microphone 20, crystal oscillator 21, third frequency converter or mixer 22, amplifier 23, driver amplifier-modulator 24, power amplifier-modulator 25, and transmitting antenna circuit 26, in addition to the AF amplifier 16 and first local oscillator 18 that are shared by both receiver and transmitter sections.

The oscillator 21 is connectable to any of four quartz crystals $c1$ to $c4$ by means of a switch S3 to produce an output signal $f3$ with a frequency of 10.635, 10.625, 10.615, or 10.595 MHz. The third frequency converter 22 combines this oscillator signal $f3$ with the first local oscillator signal $f1$ to provide transmitting frequencies $fs$ in the band of 26.965 to 27.255 MHz. The driver amplifier-modulator 24 and power amplifier-modulator 25 receives the speech or intelligence signal from the microphone 20 via the AM amplifier 16 and modulates the carrier amplitude by the intelligence signal.

In the receiver section of this prior art transceiver the switch S1 is selectively actuated in accordance with the incoming signal frequency so that the first local oscillator signal $f1$ of a corresponding frequency may be supplied to the first frequency converter 12 for the production of the first IF signal of about 10.7 MHz. The switch S2 is also selectively actuated in accordance with the incoming signal frequency to supply the second local oscillator signal $f2$ of a desired frequency to the second frequency converter 13.

It will therefore be evident that the second intermediate frequency can be set at the constant value of 455 kHz by suitably selecting and combining the first and second local oscillator frequencies $f1$ and $f2$ with the incoming RF signal of various frequencies in the specified band. To this end the following equation must be established:

$$fs = f1 - (455 + f2)$$

where $fs$ is the incoming signal frequency in kilohertz, and $f1$ and $f2$ are the first and second local oscillator frequencies in kilohertz that are actually supplied to the first and second frequency converters 12 and 13 by selective switching of the six quartz crystals $a1$ to $a6$ and of the four quartz crystals $b1$ to $b4$, respectively.

In the transmitter section, on the other hand, the third frequency converter 22 is selectively supplied with the six first local oscillator signals $f1$ and the four oscillator signals $f3$. By combination of these signals $f1$ and $f3$ the desired transmitting frequency $fs$ can be obtained in accordance with the equation $fs = f1 - f3$. It is possible in this manner to provide 23 different transmitting frequencies in the RF band of 26.965 to 27.255 MHz.

The known transceiver configuration of FIG. 1 makes it unnecessary to provide 23 quartz crystals for 23-channel communication. The prior art transceiver, however, still requires as many as 10 quartz crystals for 23-channel reception and 14 quartz crystals for 23-channel transmission and reception. The manufacturing costs of this type of transceivers are therefore inevitably high.

There has been known an advanced form of the above described prior art transceiver, in which the first local oscillator 18 is replaced by a frequency synthesizer with the phase-locked loop techniques which is capable of providing a choice of 23 different frequencies. Owing to the provision of this PLL frequency synthesizer one quartz crystal suffices for the crystal $a1$ to $a6$, another for the crystals $b1$ to $b4$, and still another for the crystals $c1$ to $c4$. Thus a total of three quartz crystals perform the complete functions which have required 14 crystals in the conventional transceiver of FIG. 1. The three quartz crystals and three crystal oscillators used in this advanced prior art transceiver, however, can be further reduced in number according to the present invention, which also utilizes the PLL frequency synthesizer.

Figure 2:
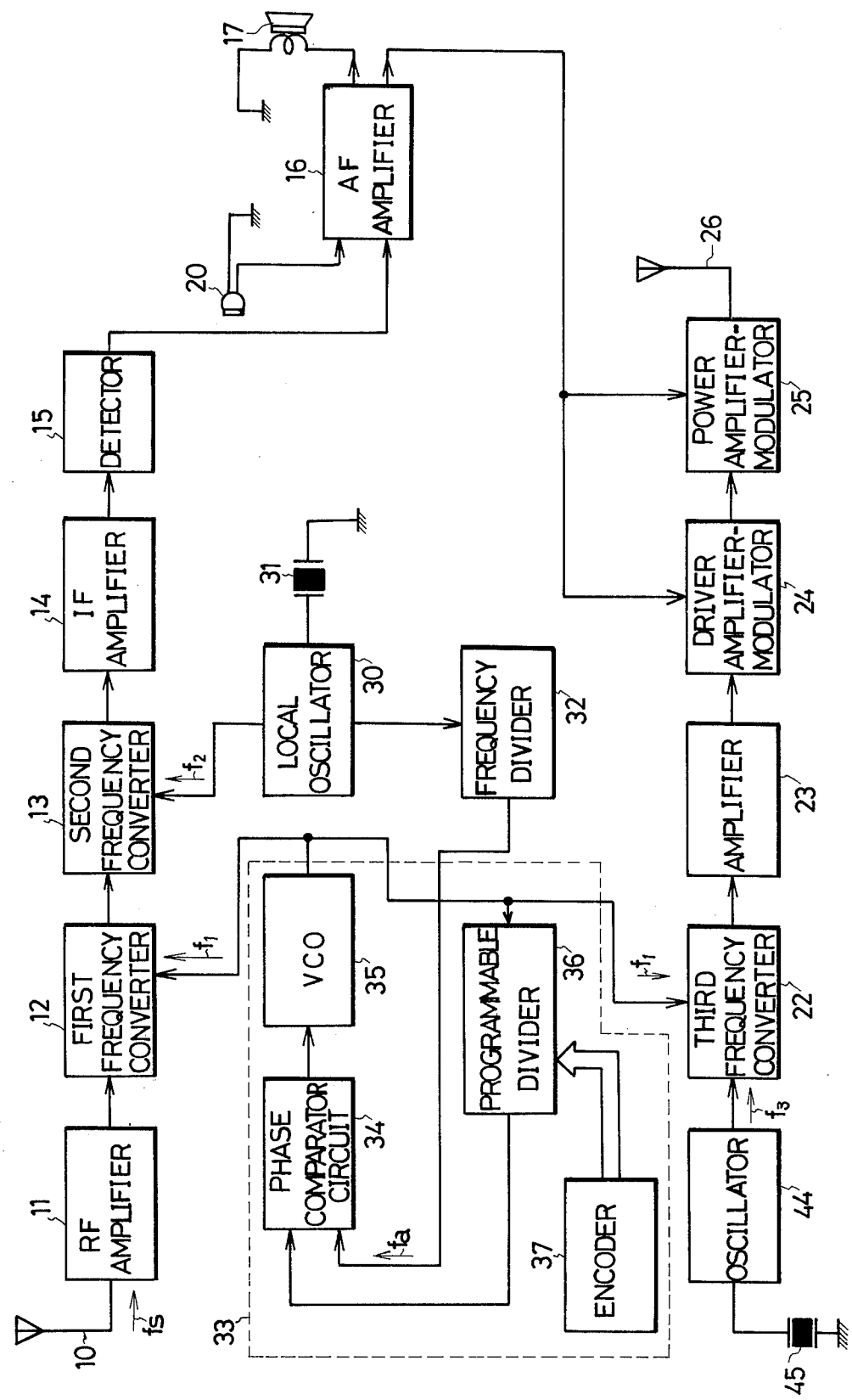
FIG. 2 is a block diagram of a transceiver incorporating a preferred form of the double superheterodyne multichannel receiver according to the invention.

In FIG. 2 the double superheterodyne multichannel receiver according to the invention is shown adapted for a transceiver by way of example only. In this diagram the circuit components designated 10 to 17, 20, and 22 to 26 can be essentially equivalent in construction and functions to those designated by the same reference numerals in the prior art representation of FIG. 1, so that the description of these circuit components will be omitted.

Shown at 30 in FIG. 2 is a local oscillator for reception, which has but one quartz crystal 31. This local oscillator produces an output signal $f2$ with a constant frequency of, for example, 10.24 MHz as determined by the natural frequency of vibration of the quartz crystal 31. The output signal $f2$ from the local oscillator 30 is delivered to the second frequency converter 13 of the receiver section on the one hand and, on the other hand, to a frequency divider 32.

As is well known, the frequency of the output from the frequency divider is an integral submultiple of the input frequency. In this particular adaptation of the invention the frequency divider 32 is assumed to divide the input frequency to $\frac{1}{2}^{10}$, so that the frequency divider produces the output signal $fa$ with a reference frequency of 10 kHz. This reference frequency signal $fa$ from the frequency divider is delivered to a PLL frequency synthesizer generally labeled 33.

Figure 3:
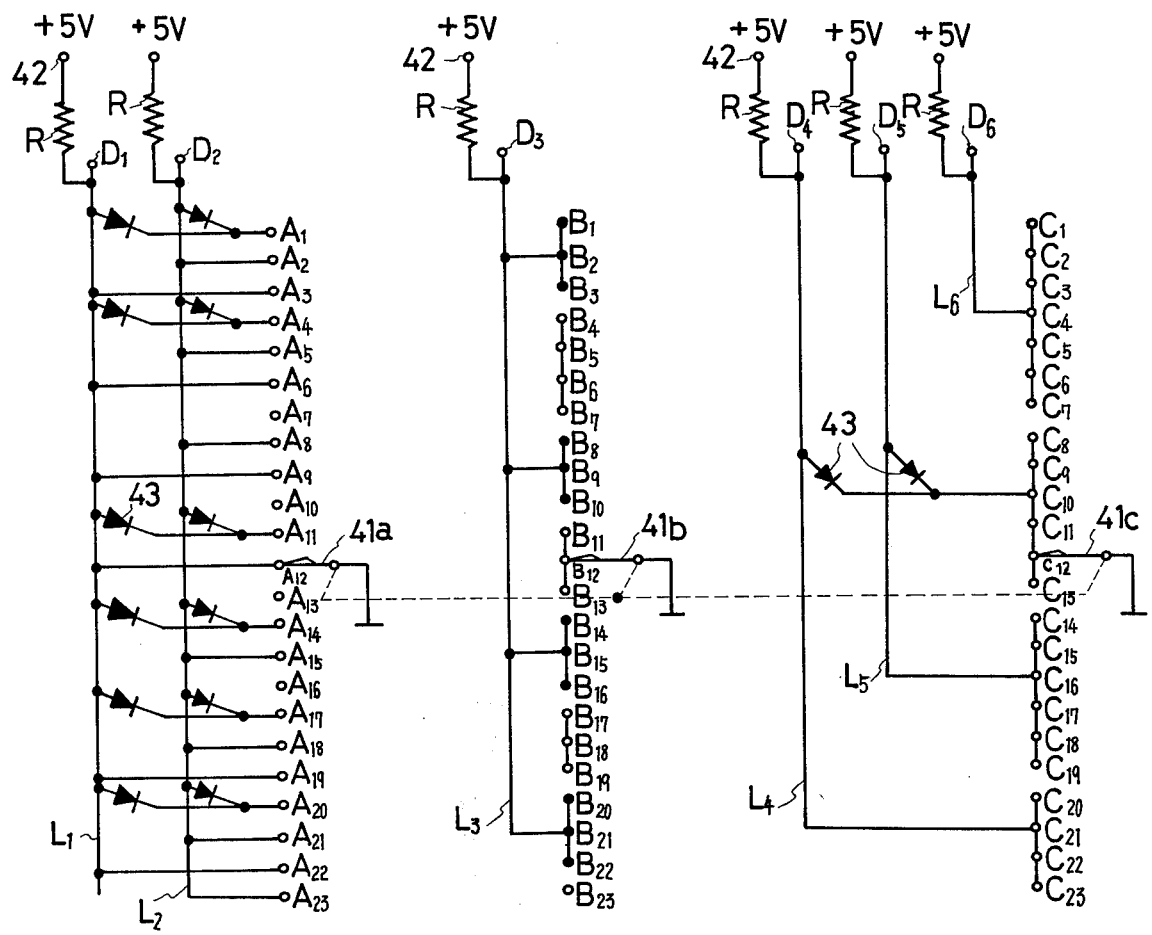
FIG. 3 is a schematic electrical diagram showing in detail the configuration of the encoder used in the transceiver of FIG. 2.

The PLL frequency synthesizer 33 comprises a phase comparator circuit 34 with a built-in low-pass filter and amplifier, voltage-controlled oscillator (VCO) 35, programmable divider 36, and encoder 37 having a channel selector switch (shown in detail in FIG. 3). More specifically, the frequency divider 32 has its output connected to the phase comparator 34, to which there is also connected the output of the programmable divider 36. The output of the phase comparator 34 is connected to the VCO 35. The output from the VCO 35 is, on the one hand, fed back to the phase comparator 34 via the programmable divider 36 and, on the other hand, delivered to the first frequency converter 12 of the receiver section and to the third frequency converter 22 of the transmitter section.

Figure 4:
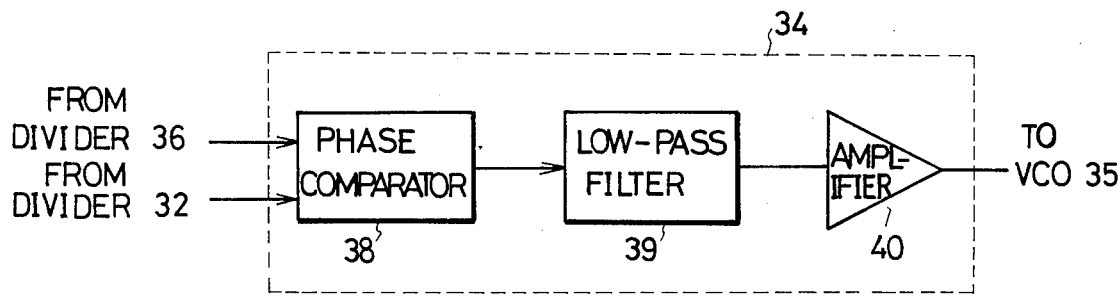
FIG. 4 is a block diagram of the phase comparator circuit used in the transceiver of FIG. 2.

As illustrated in FIG. 4, the phase comparator circuit 34 comprises phase comparator 38, low-pass filter 39 and amplifier 40 in serial connection. In one form of construction the phase comparator circuit 34 can be the IC chip MC 4044 manufactured by Motorola Semiconductor Products Inc., of the United States. Also the VCO 35 can take the form of the IC chip MC 4024, of Motorola, and the programmable divider 36 can take the form of a cascade connection of the IC chips MC 74416, of Motorola.

FIG. 3 illustrates the detailed configuration of the encoder 37. The encoder includes the channel selector switch having three ganged movable contacts 41a, 41b and 41c each grounded at one end. The movable contact 41a is selectively closable to any of 23 fixed contacts A1 to A23; the movable contact 41b is selectively closable to any of 23 fixed contacts B1 to B23; and the movable contact 41c is selectively closable to any of 23 fixed contacts C1 to C23. It is to be understood, however, that the three ganged movable contacts 41a to 41c are always closed to the corresponding ones of the three groups of fixed contacts A, B and C. In the showing of FIG. 3, for example, the three movable contacts are in touch with the corresponding fixed contacts A12, B12 and C12, respectively.

The encoder 37 has lines L1 to L6 which are connected to the fixed contacts as shown and which are shown to be individually connected to +5-volt supply terminals 41 via respective resistors R. Diodes 43 are connected respectively between the lines L1 and L2 and the fixed contacts A1, A4, A11, A14, A17 and A20 and between the lines L4 and L5 and the fixed contact C10. The lines L1 to L6 are also provided with encoder output terminals D1 to D6, respectively. The output signals produced from these output terminals D1 to D6 are delivered to the programmable divider 36 of FIG. 2 via a gate circuit (not shown).

Let it be assumed that, in the encoder network of FIG. 3, the three movable contacts 41a to 41c are now closed to the fixed contacts A1, B1 and C1 for selection of the first communication channel. Since then the fixed contacts A1, B1 and C1 become grounded via the three movable contacts, the encoder output terminals D1 to D6 will produce, in combination, the binary digital output "000110." In this manner the encoder 37 provides 23 different binary digital outputs corresponding to the 23 communication channels. In accordance with these 23 different outputs from the encoder 37, the frequency dividing ratio of the programmable divider 36 is also to be varied into 23 different ones.

With reference back to FIG. 2 the transmitter section of the transceiver has a crystal oscillator 44 which, unlike the crystal oscillator 21 of FIG. 1, has a single quartz crystal 45. The oscillator 44 is adapted to supply to the third frequency converter 22 the output $f3$ with a frequency of, say 10.695 MHz as determined by the natural frequency of vibration of the quartz crystal 45.

The transceiver according to the invention being constructed as described hereinbefore with reference to FIGS. 2 to 4, the operation of its receiver section will first be described. The second frequency converter 13 is supplied with the local oscillator signal $f2$ with the constant frequency of 10.24 MHz which is determined by the natural frequency of vibration of the quartz crystal 31 provided to the local oscillator 30.

To the first frequency converter 12, on the other hand, the VCO 35 of the PLL frequency synthesizer 33 supplies the signal $f1$ with a selected frequency corresponding to the frequency of the incoming RF signal $fs$. The frequency of this PLL frequency synthesizer signal $f1$ is selected from among the 23 different frequencies in the range of, for example, 16.270 to 16.560 MHz so that the first IF signal produced by the first frequency converter 12 may have a constant frequency of, for example, 10.695 MHz. In other words, the PLL frequency synthesizer signal frequency $f1$ is determined in accordance with the equation $f1 = fs = f1F1$, where $f1F1$ is the first IF signal frequency. If the incoming RF signal frequency is 26.965 MHz, for example, then the PLL frequency synthesizer signal frequency is selected to be 16.270 MHz.

The selection of the desired PLL frequency synthesizer signal frequency from among the 23 different frequencies is accomplished by the switching of the three ganged movable contacts 41a to 41c with respect to the respective groups of fixed contacts A, B and C in the encoder 37 of FIG. 3. The PLL frequency synthesizer signal frequency will be 16.270 MHz if the movable contacts 41a to 41c are closed to the fixed contacts A1, B1 and C1, and 16.560 MHz if the movable contacts are closed to the fixed contacts A23, B23 and C23.

Each time the movable contacts 41a to 41c are switched to a different set of fixed contacts in the encoder 37, a corresponding digital output is delivered as aforesaid to the programmable divider 36 to cause the desired change in the output frequency from the VCO 35, that is, from the PLL frequency synthesizer 33. Let $1/N$ be the frequency dividing ratio of the programmable divider 36. Since $f1/N = fa$, the output frequency from the VCO 35, or from the PLL frequency synthesizer 33, is determined in accordance with the formula $f1 = N \times fa$.

With the change in the output frequency from the VCO 35, the phase comparator circuit 34 compares the 10 kHz reference frequency from the frequency divider 32 and the VCO frequency that has passed through the programmable divider 36. Control is then effected in the well known manner so that the output frequency from the programmable divider 36 may approach the 10 kHz reference frequency. The output from the VCO 35 is then locked on the desired new frequency.

Thus the PLL frequency synthesizer 33 delivers to the first frequency converter 12 the signal $f1$ having a stable frequency selected from among the 23 different frequencies by the actuation of the channel selector switch provided to the encoder 37. It is possible in this manner to effect the RF signal reception over 23 channels by the receiver section of the transceiver according to this invention.

In the use of the transceiver as the transmitter, the PLL frequency synthesizer signal $f1$ with a stable frequency selected from among the 23 different frequencies as above explained is delivered to the third converter 22 of the transmitter section. In this third frequency converter the signal $f1$ is combined with the signal $f3$ from the oscillator 44 having the single quartz crystal 45. Since the oscillator signal frequency is assumed to be 10.695 MHz, the mixing of this frequency with the 23 different PLL frequency synthesizer signal frequencies in the band of 16.270 to 16.560 MHz results in the provision of 23 different transmitting frequencies in the band of 26.965 to 27.255 MHz.

The RF output signal with any selected frequency from the third frequency converter 22 is amplified as it passes through the amplifier 23, driver amplifier-modulator 24 and power amplifier-modulator 25. In the amplifier-modulators 24 and 25, moreover, the outgoing RF signal undergoes amplitude modulation by the intelligence signal supplied from the microphone 20 via the AF amplifier 16. The amplitude-modulated RF signal is then transmitted through the antenna circuit 26.

As may be apparent from the foregoing description, the improved transceiver configuration according to the invention requires only one crystal oscillator 30 with one quartz crystal 31 in its receiver section, and another crystal oscillator 44 with one quartz crystal 45 in the transmitter section. Furthermore, in the encoder 37 of FIG. 3, the channel selector switch has only three ganged movable contacts for the production of the six-bit output, so that the number of the diodes 43 constituting the diode matrix can be minimized.

With the invention thus fully described a variety of modifications or changes will readily occur to those skilled in the art on the basis of this disclosure. For example, a prescaler may be provided between the VCO 35 and programmable divider 36. The entire PLL frequency synthesizer 33 may be constituted of a single IC chip. A filter may be connected between the first and second frequency converters 12 and 13. Another IF amplifier, in addition to the IF amplifier 14, may be connected next to the first frequency converter 12 for amplification of the first IF signal produced by the latter. A filter may be connected next to the second frequency converter 13. A squelch circuit or noise suppressor may be connected next to the detector 15. The various frequency values set forth in this specification are arbitrary. Moreover, while the receiver according to this invention has been shown and described as adapted for a transceiver, the invention itself is not to be restricted to this particular adaptation.

The above and other modifications or changes within the usual knowledge of the specialists are intended in the foregoing disclosure. It is therefore appropriate that the invention be construed broadly and in a manner consistent with the fair meaning or proper scope of the following claims.

I claim:

1. A transceiver capable of multichannel reception and a multichannel transmission, comprising in combination:
   input means for reception of an incoming radio frequency signal;
   a radio frequency amplifier for amplification of the incoming radio frequency signal;
   a first frequency converter for conversion of the amplified radio frequency signal from said radio frequency amplifier into a first intermediate frequency signal;
   a second frequency converter for conversion of the first intermediate frequency signal from said first frequency converter into a second intermediate frequency signal;
   a crystal-controlled local oscillator having a single crystal unit for production of an output signal of a predetermined frequency, the output signal from said local oscillator being supplied to said second frequency converter and being thereby combined with the first intermediate frequency signal from said first frequency converter to provide the second intermediate frequency signal;
   a frequency divider for dividing the frequency of the output signal from said local oscillator at a predetermined ratio to provide an output signal having a reference frequency;
   a phase-locked loop frequency synthesizer which is supplied with the reference frequency signal from said frequency divider and which supplies to said first frequency converter an output signal of a frequency selected in accordance with the frequency of the incoming radio frequency signal, the output signal from said frequency synthesizer being combined by said first frequency converter with the amplified radio frequency signal from said radio frequency amplified to provide the first intermediate frequency signal having a predetermined frequency regardless of the frequency of the incoming radio frequency signal;
   an intermediate frequency amplifier for amplification of the second intermediate frequency signal from said second frequency converter;
   a detector for demodulation of the amplified second intermediate frequency signal from said intermediate frequency amplifier;
   output means for translating output from said detector into audible sound;
   a crystal-controlled oscillator having a single crystal unit for production of an output signal having the same frequency as the first intermediate frequency signal produced by said first frequency converter;
   a third frequency converter for production of a signal of a desired transmitting frequency by combining the output signal from said oscillator with the output signal from said frequency synthesizer;
   means for amplification of the transmitting frequency signal from said third frequency converter;
   means for modulating the amplified transmitting frequency signal by an intelligence signal;
   means for supplying the intelligence signal to said modulating means; and
   means for radiating the modulated transmitting frequency signal into space.

2. The transceiver as recited in claim 1, wherein said phase-locked loop frequency synthesizer comprises:
   a phase comparator circuit including a low-pass filter and an amplifier;
   a voltage-controlled oscillator connected to the output of said phase comparator circuit; and
   a programmable divider connected between said voltage-controlled oscillator and said phase comparator circuit;
   said reference frequency signal from said frequency divider being supplied to said phase comparator circuit.

* * * * *

UNITED STATES PATENT AND TRADEMARK OFFICE
CERTIFICATE OF CORRECTION

PATENT NO. : 4,027,242
DATED : May 31, 1977
INVENTOR(S) : Hiromasa Yamanaka

It is certified that error appears in the above-identified patent and that said Letters Patent are hereby corrected as shown below:

Column 8, line 29, the word "amplified" should read -- amplifier --.

Signed and Sealed this

Twenty-seventh Day of September 1977

[SEAL]

Attest:

RUTH C. MASON
Attesting Officer

LUTRELLE F. PARKER
Acting Commissioner of Patents and Trademarks